United States Patent
Hwang

(10) Patent No.: US 9,432,006 B2
(45) Date of Patent: Aug. 30, 2016

(54) BUFFER CIRCUIT AND SYSTEM HAVING THE SAME

(71) Applicant: SK hynix Inc., Icheon-si Gyeonggi-do (KR)

(72) Inventor: Jin Ha Hwang, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/608,302

(22) Filed: Jan. 29, 2015

(65) Prior Publication Data

US 2016/0072487 A1    Mar. 10, 2016

(30) Foreign Application Priority Data

Sep. 4, 2014  (KR) .................. 10-2014-0117683

(51) Int. Cl.
*H03K 5/02* (2006.01)
*H03L 5/00* (2006.01)

(52) U.S. Cl.
CPC ............ *H03K 5/023* (2013.01); *H03L 5/00* (2013.01)

(58) Field of Classification Search
CPC .......... H03K 5/02; H03K 5/023; H03L 5/00
USPC ...... 326/62, 82, 83; 327/108, 109, 110, 111, 327/112, 306, 331, 333
See application file for complete search history.

(56) References Cited

U.S. PATENT DOCUMENTS

| | | | |
|---|---|---|---|
| 5,544,110 A * | 8/1996 | Yuh | G11C 7/065 327/55 |
| 6,784,717 B1 * | 8/2004 | Hunt | H03K 5/08 326/62 |
| 7,023,277 B1 * | 4/2006 | Perner | G11C 7/062 330/257 |
| 7,298,201 B2 | 11/2007 | Ogasawara | |
| 7,317,338 B2 | 1/2008 | Lee | |
| 7,511,555 B2 * | 3/2009 | Suzuki | H03K 3/35613 326/81 |
| 8,212,587 B2 * | 7/2012 | Yeung | H04B 3/36 326/82 |
| 9,293,912 B2 * | 3/2016 | Parthasarathy | H02H 9/04 |
| 2005/0099234 A1 * | 5/2005 | Perner | H04N 21/4305 330/261 |
| 2007/0257724 A1 * | 11/2007 | Suzuki | H03K 3/35613 327/333 |
| 2011/0241736 A1 * | 10/2011 | Lee | H03K 5/082 327/108 |

FOREIGN PATENT DOCUMENTS

KR    1020120070426 A    6/2012

\* cited by examiner

*Primary Examiner* — William Hernandez
(74) *Attorney, Agent, or Firm* — William Park & Associates Ltd.

(57) ABSTRACT

A buffer circuit includes a power supply voltage detection block which may detect a voltage level of a power supply voltage, a bias generation block which may generate a constant bias signal and a plurality of enable bias signals based on the detection result of the power supply voltage, and an input buffer which may amplify an input signal in response to the constant bias signal and the plurality of enable bias signals.

19 Claims, 5 Drawing Sheets

BUFFER CIRCUIT AND SYSTEM HAVING THE SAME

CROSS-REFERENCES TO RELATED APPLICATION

The present application claims priority under 35 U.S.C. §119(a) to Korean application number 10-2014-0117683 filed on Sep. 4, 2014, in the Korean Intellectual Property Office, which is incorporated herein by reference in its entirety.

BACKGROUND

1. Technical Field

Embodiments of the present invention generally relate to a semiconductor apparatus, and more particularly, in one or more embodiments, to a buffer circuit of a semiconductor apparatus.

2. Related Art

An electronic device may include a transmission circuit for transmitting current and/or a voltage as a signal and a reception circuit for receiving the signal transmitted from the transmission circuit. The reception circuit may amplify the signal by using a differential amplifier, which is supplied with a power supply voltage.

FIG. 1 is a diagram illustrating the configuration of a known input buffer 10. In FIG. 1, the buffer circuit 10 may include first, second, and third transistors T1, T2, and T3. The third transistor T3 may form the current path of the buffer circuit 10 by receiving a bias voltage BIAS. The first and second transistors T1 and T2 may respectively receive an input signal IN and a reference voltage VREF. When the input signal IN is a high level, since the voltage level of a node A is relatively higher than the voltage level of a node B, the buffer circuit 10 may output an output signal OUT of a high level. Also, when the input signal IN is a low level, since the voltage level of the node A is relatively lower than the voltage level of the node B, the buffer circuit 10 may output the output signal OUT of a low level.

The buffer circuit 10, which amplifies a signal having small current or low voltage level, may be sensitive to a variation in process, voltage and temperature. When the buffer circuit 10 use a power supply voltage VDD as the bias voltage BIAS, because the power supply voltage VDD may vary in its level according to an operating situation of a semiconductor apparatus which includes the buffer circuit 10 therein, the output timing and duty of the output signal OUT outputted from the buffer circuit 10 may become unstable according to a variation in the level of the power supply voltage VDD.

SUMMARY

Various embodiments are directed to a buffer circuit which is insensitive to a level variation of a power supply voltage by using bias signals with different characteristics.

In an embodiment of the present invention, a buffer circuit may include an input buffer configured to be enabled in response to a constant bias signal and a plurality of enable bias signals, and amplify an input signal, a power supply voltage detection block configured to detect a level of a power supply voltage, and a bias generation block configured to generate the constant bias signal and the plurality of enable bias signals, based on a detection result of the power supply voltage detection block.

In an embodiment of the present invention, a buffer circuit may include a bias generation block configured to generate a plurality of enable bias signals, and a constant bias signal which has a level change range more insensitive to a variation in a level of a power supply voltage than the enable bias signals, and an input buffer configured to be enabled in response to the plurality of enable bias signals and the constant bias signal, and amplify an input signal.

In an embodiment of the present invention, a system may include a power supply voltage detection block configured to detect a voltage level of a power supply voltage, and an input buffer configured to amplify an input signal based on the detection of the power supply voltage, which has been carried out at the power supply voltage detection block, and wherein the input buffer may comprise a current mirror which includes first and second enable units, and wherein the first enable unit forms a current path when the power supply voltage is different from a normal level, and the second enable unit forms a current path when the power supply voltage has the normal level.

DETAILED DESCRIPTION

Figure 1:
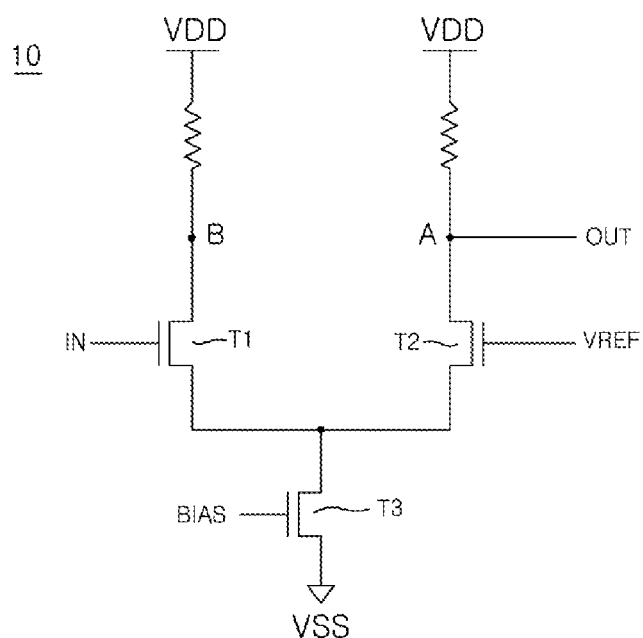
FIG. 1 is a diagram illustrating the configuration of a known input buffer.
Figure 2:
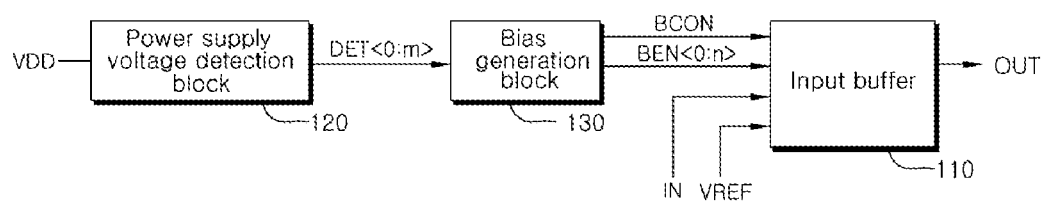
FIG. 2 is a block diagram illustrating a configuration example of a buffer circuit in accordance with an embodiment of the present invention.

Referring to FIG. 2, a buffer circuit 1 in accordance with an embodiment of the present invention may include an input buffer 110, a power supply voltage detection block 120, and a bias generation block 130.

The input buffer 110 may receive a constant bias signal BCON, a plurality of enable bias signals BEN<0:n> and an input signal IN, and generate an output signal OUT. The input buffer 110 may be enabled in response to the constant bias signal BCON and the plurality of enable bias signals BEN<0:n>, and may amplify the input signal IN and generate the output signal OUT when enabled. When the input buffer 110 uses single-ended signaling, the input buffer 110 may further receive a reference voltage VREF to sense and amplify the input signal IN. The reference voltage VREF may have a level corresponding to half the peak-to-peak amplitude of the input signal IN. For example, if the input signal IN has a ground voltage VSS as the lowest amplitude value and a power supply voltage VDD as the highest amplitude value, the highest amplitude value of the reference voltage VREF may be half the power supply voltage VDD.

The power supply voltage detection block 120 may detect the level of the power supply voltage VDD. The power supply voltage detection block 120, which has detected the level of the power supply voltage VDD, may generate detection signals DET<0:m>. For example, the power supply voltage detection block 120 may generate the detection signals DET<0:m> whose level increases as the level of the power supply voltage VDD increases, and decreases as the level of the power supply voltage VDD decreases.

The bias generation block 130 may generate the constant bias signal BCON and the plurality of enable bias signals BEN<0:n> in response to the detection signals DET<0:m>. A variation in the voltage level of the constant bias signal BCON may be relatively insensitive to a variation in the voltage level of the power supply voltage VDD, whereas a variation in the voltage levels the enable bias signals BEN<0:n> may be relatively sensitive to a variation in the voltage level of the power supply voltage VDD. In terms of voltage variations according to a voltage variation of the power supply voltage VDD, the constant bias signal BCON may have a narrower range of voltage level than the enable bias signals BEN<0:n>. The constant bias signal BCON and the plurality of enable bias signals BEN<0:n> may enable the input buffer 110 to form current paths of the input buffer 110. The bias generation block 130 may form the current paths of the input buffer 110 to a predetermined extent according to the detection signals DET<0:m> generated by detecting the power supply voltage VDD so that the input buffer 110 may stably generate the output signal OUT regardless of a voltage variation of the power supply voltage VDD.

Figure 3:
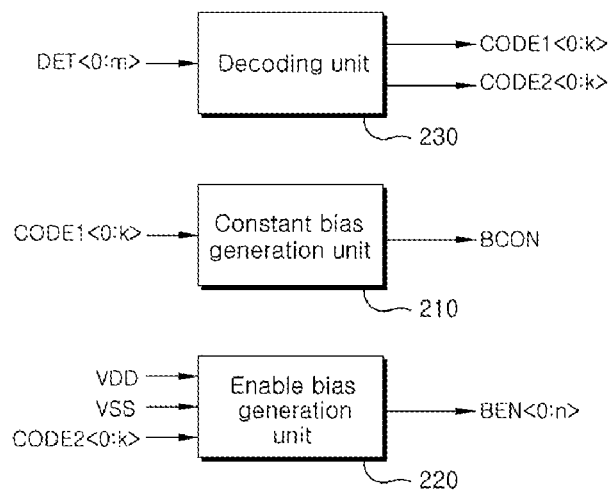
FIG. 3 is a block diagram illustrating an example of the configuration of the bias generation block shown in FIG. 2.

FIG. 3 is a block diagram illustrating an example of the configuration of the bias generation block 130 shown in FIG. 2. In FIG. 3, the bias generation block 130 may include a constant bias generation unit 210 and an enable bias generation unit 220. The constant bias generation unit 210 may generate the constant bias signal BCON based on the detection of the power supply voltage VDD, which has been carried out at the power supply voltage detection block 120. The bias generation block 130 may further include a decoding unit 230. The decoding unit 230 may decode the detection signals DET<0:m>, and generate first detection decoding signals CODE1<0:k> and second detection decoding signals CODE2<0:k>. The constant bias generation unit 210 may change the voltage level of the constant bias signal BCON in response to the first detection decoding signals CODE1<0:k>.

The enable bias generation unit 220 may generate the plurality of enable bias signals BEN<0:n> based on the detection of the power supply voltage VDD, which has been carried out at the power supply voltage detection block 120. The enable bias generation unit 220 may generate the plurality of enable bias signals BEN<0:n> in response to the second detection decoding signals CODE2<0:k> generated by the decoding unit 230. Each of the enable bias signals BEN<0:n> may have one of the level of the power supply voltage VDD and the level of the ground voltage VSS. The enable bias generation unit 220 may change the number of enable bias signals BEN<0:n> which have the level of the power supply voltage VDD in response to the second detection decoding signals CODE2<0:k>. In an embodiment of the present invention, the first and second detection decoding signals CODE1<0:k> and CODE2<0:k> generated by the decoding unit 230 may have the same number of bits as each other. In an embodiment of the present invention, the first and second detection decoding signals CODE1<0:k> and CODE2<0:k> may have different numbers of bits and may have different logic values.

Figure 4:
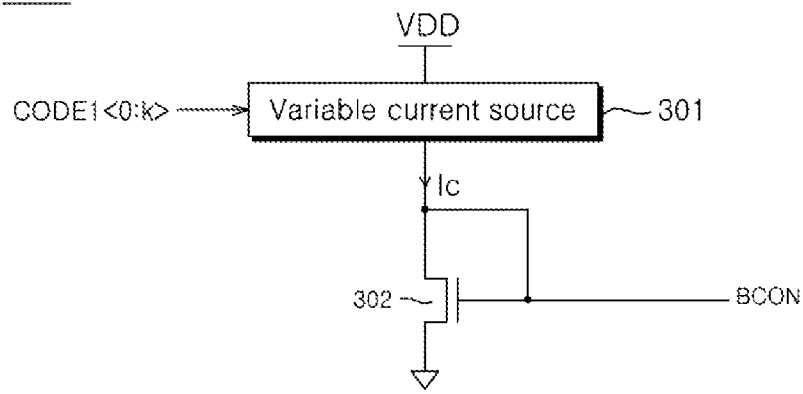
FIG. 4 is a block diagram illustrating an example of the configuration of the constant bias generation unit shown in FIG. 3.

FIG. 4 is a block diagram illustrating an example of the configuration of the constant bias generation unit 210 shown in FIG. 3. In FIG. 4, the constant bias generation unit 210 may include a variable current source 301 and a transistor 302. The variable current source 301 may generate current Ic which may vary in its amount according to the first detection decoding signals CODE1<0:k>. For example, the variable current source 301 may increase or decrease the amount of the current Ic in response to the first detection decoding signals CODE1<0:k> in the case where the level of the power supply voltage VDD is lower or higher than a predetermined level. The variable current source 301 may be coupled to the power supply voltage VDD. The transistor 302 has a drain coupled to the variable current source 301, a source coupled to the ground voltage VSS, and a gate coupled to the drain. The constant bias signal BCON may be outputted from a node to which the gate and the drain are coupled. The transistor 302 may serve as a resistor, and the constant bias signal BCON may have a voltage level corresponding to the amount of the current Ic. For example, the constant bias signal BCON may have a high voltage level if the amount of current generated by the variable current source 301 is large, and may have a low voltage level if the amount of current generated by the variable current source 301 is small. In an embodiment of the present invention, the constant bias generation unit 210 may minimize the effect of variation in the power supply voltage VDD on the constant bias signal BCON by allowing the constant bias signal BCON to have a voltage level corresponding to the current Ic generated by the variable current source 301.

Figure 5:
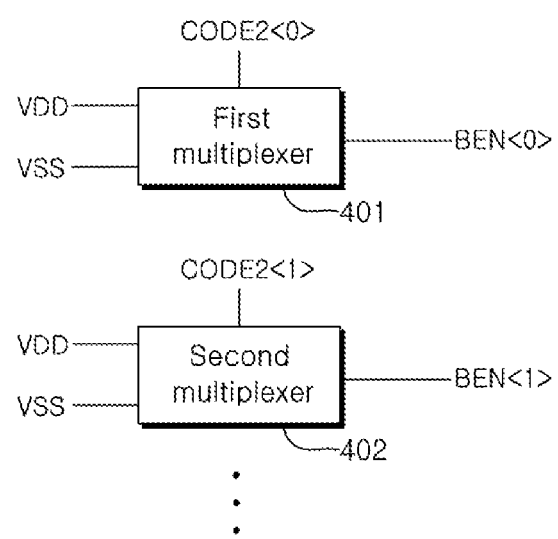
FIG. 5 is a block diagram illustrating an example of the configuration of the enable bias generation unit shown in FIG. 3.

FIG. 5 is a block diagram illustrating an example of the configuration of the enable bias generation unit 220 shown in FIG. 3.

The enable bias generation unit 220 may include a plurality of multiplexers, for example, first and second multiplexers 401 and 402. Each multiplexer may output one of the power supply voltage VDD and the ground voltage VSS as the enable bias signals BEN<0:n> in response to the second detection decoding signals CODE2<0:k>. For example, as shown in FIG. 5, the first multiplexer 401 may receive the first bit CODE2<0> of the second detection decoding signals CODE2<0:k> and output one of the power supply voltage VDD and the ground voltage VSS as the first enable bias signal BEN<0>, and the second multiplexer 402 may receive the second bit CODE2<1> of the second detection decoding signals CODE2<0:k> and output one of the power supply voltage VDD and the ground voltage VSS as the second enable bias signal BEN<1>. The enable bias signals BEN<0:n> may have the level of the power supply voltage VDD according to the second detection decoding signals CODE2<0:k>. Accordingly, the levels of the enable bias signals BEN<0:n> may vary according to a variation in the level of the power supply voltage VDD.

Figure 6:
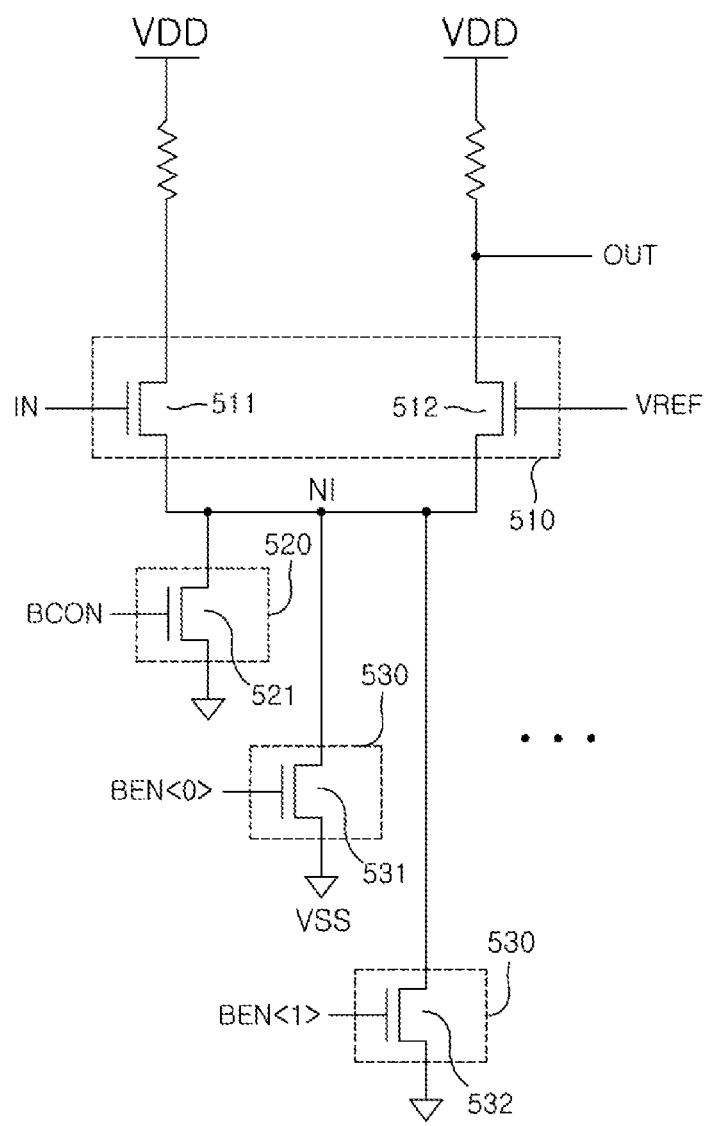
FIG. 6 is a block diagram illustrating an example of the configuration of the input buffer shown in FIG. 2.

FIG. 6 is a block diagram illustrating an example of the configuration of the input buffer 110 shown in FIG. 2. In FIG. 6, the input buffer 110 may include an amplification unit 510, a first enable unit 520, and second enable units 530. The amplification unit 510 may receive an input signal IN and a reference voltage VREF and generate an output signal OUT. The amplification unit 510 may sense and amplify the input signal IN and the reference voltage VREF and generate the output signal OUT when the current paths of the input buffer 110 are formed. The amplification unit 510 may include first and second transistors 511 and 512. The first transistor 511 has a gate which may receive the input signal IN, a drain which may receive the power supply voltage VDD through a resistor, and a source coupled to a node NI.

The second transistor 512 has a gate which may receive the reference voltage VREF, a drain which may receive the power supply voltage VDD through a resistor, and a source coupled to the node NI. The output signal OUT may be outputted from a node to which the drain of the second transistor 512 is electrically coupled.

The first enable unit 520 may form a current path of the input buffer 110 in response to the constant bias signal BCON. The first enable unit 520 may be electrically coupled to the node NI and the ground voltage VSS. The input buffer 110 may include at least one first enable unit 520. In FIG. 6, the first enable unit 520 may include a third transistor 521. The third transistor 521 has a gate which may receive the constant bias signal BCON, a drain coupled to the node NI, and the source coupled to the ground voltage VSS. The third transistor 521 may form the current path between the node NI and the ground voltage VSS in response to the constant bias signal BCON.

The second enable units 530 may form the current paths of the input buffer 110 in response to the enable bias signals BEN<0:n>. The second enable units 530 may be electrically coupled to the node NI and the ground voltage VSS. The input buffer 110 may include at least two second enable units 530. For example, the number of the second enable units 530 may correspond to the number of the plurality of enable bias signals BEN<0:n>. In FIG. 6, for example, two second enable units 530 are shown, and the second enable units 530 may include fourth and fifth transistors 531 and 532, respectively. The fourth transistor 531 has a gate which may receive the first enable bias signal BEN<0>, a drain coupled to the node NI, and the source coupled to the ground voltage VSS. The fourth transistors 531 may form a current path between the node NI and the ground voltage VSS in response to the first enable bias signal BEN<0>. The fifth transistor 532 has a gate which may receive the second enable bias signal BEN<1>, a drain coupled to the node NI, and the source coupled to the ground voltage VSS. The fifth transistors 532 may form a current path between the node NI and the ground voltage VSS in response to the second enable bias signal BEN<1>.

The input buffer 110 may sense and amplify the input signal IN and the reference voltage VREF and generate the output signal OUT when the first and second enable units 520 and 530 form the current paths in response to the constant bias signal BCON and the plurality of enable bias signals BEN<0:n>. In the case where the level of the input signal IN is higher than the level of the reference voltage VREF, since current flowing to the ground voltage VSS through the first transistor 511 is larger than current flowing through the second transistor 512, the output signal OUT may be a signal of a high level. In the case where the level of the input signal IN is lower than the level of the reference voltage VREF, since current flowing to the ground voltage VSS through the second transistor 512 is larger than current flowing through the first transistor 511, the output signal OUT may be a signal of a low level. In this way, since the output signal OUT may be generated according to the current flowing through the current paths which are formed by the first and second enable units 520 and 530. In an embodiment of the present invention, the current paths such as the first and second enable units 520 and 530 may be set to form current paths to the extent to which current flowing through the current paths may be within a predetermined range, thereby stably generating the output signal OUT.

Figure 7:
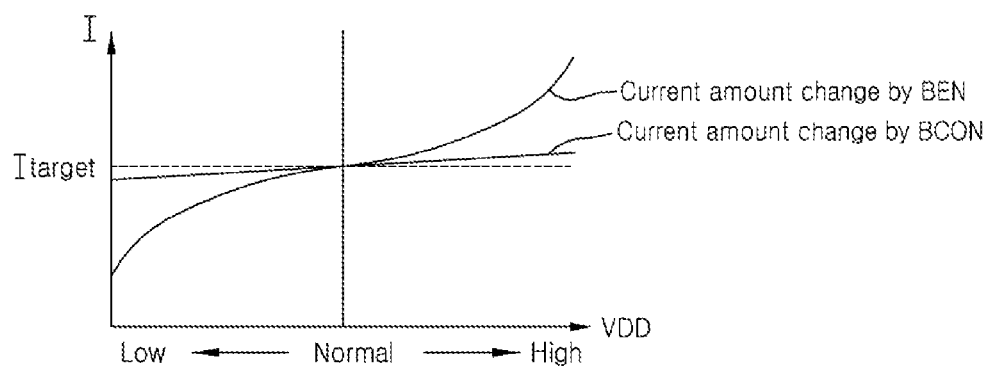
FIG. 7 is a graph illustrating current which may flow through current paths of the input buffer in accordance with an embodiment of the present invention.

FIG. 7 is a graph illustrating current which may flow through the current paths formed through the first and second enable units 520 and 530 according to the constant bias signal BCON and the enable bias signals BEN<0:n>. The amounts of current may represent how much the current paths are formed. The horizontal axis of the graph corresponds to the voltage level of a power supply voltage VDD, and the vertical axis of the graph corresponds to amount of current I. Target current $I_{target}$ may represent an ideal amount of current which may flow through the current paths formed through the first and second enable units 520 and 530. Current which may flow through a transistor may be defined as in the following equation.

$$I_0 = \frac{1}{2} * k_n * (W/L) * (V_{gs} - V_{th})^2 * (1 + \lambda * V_{ds})$$

Here, $I_0$ may mean current which flows through a transistor, $k_n$ and $\lambda$ constants, W the width of the transistor, L the length of the transistor, $V_{gs}$ the voltage between the gate and the source of the transistor, $V_{th}$ the threshold voltage of the transistor, and $V_{ds}$ the voltage between the drain and the source of the transistor.

As may be seen from the equation, "current amount changed by BEN" changes more sharply than "current amount changed by BCON" along with a voltage change at the gate of the transistor. Referring to FIG. 6, current flowing through the fourth and fifth transistors 531 and 532 drops sharply as the level of the power supply voltage VDD is lower (Low) than a normal level (Normal), and current flowing through the fourth and fifth transistors 531 and 532 rises sharply as the level of the power supply voltage VDD is higher (High) than the normal level (Normal).

Referring to FIGS. 4 and 6, the first enable unit 520 which receives the constant bias signal BCON may form a current mirror together with the constant bias generation unit 210. In this case, the amount of current flowing through the third transistor 521 may be determined by width/length ratios between the transistor 302 of the constant bias generation unit 210 and the third transistor 521. Accordingly, a buffer circuit 1 in an embodiment of the present invention may reduce/minimize a change in the amount of current flowing through the third transistor 521 despite a variation in the power supply voltage VDD by using the constant bias signal BCON.

In the case where the level of the power supply voltage VDD becomes lower or higher than a normal level, the bias generation block 130 in an embodiment of the present invention allows the current path to be formed by the third transistor 521 in response to the constant bias signal BCON rather than the current paths that may be formed by the fourth and fifth transistors 531 and 532 in response to the enable bias signals BEN<0:n>. Current flowing through the current path may be controlled within target current $I_{target}$ by adjusting the level of the constant bias signal BCON. In an embodiment of the present invention, the level of the constant bias signal BCON may be adjusted by controlling the amount of current generated by the variable current source 301. For example, in the case where the level of the power supply voltage VDD is low, the bias generation block 130 may decrease the number of turned-on second enable units 530 by decreasing the number of enable bias signals which have a voltage level of the power supply voltage VDD among the plurality of enable bias signals BEN<0:n> based on detection signals DET<0:m> of the power supply voltage detection block 120. Also, the bias generation block 130 may control the amount of current flowing through the first enable unit 520 and the second enable units 530 turned on to conform to the amount of the target current $I_{target}$ by increasing the level of the constant bias signal BCON. In the case where the level of the power supply voltage VDD has the normal level, the bias generation block 130 allows the current paths to be formed through the second enable units 530, by increasing the number of enable bias signals which have a voltage level of the power supply voltage VDD among the plurality of enable bias signals BEN<0:n>. In the case where the level of the power supply voltage VDD is high, the bias generation block 130 may control the amount of current flowing through the first enable unit 520 and the second enable units 530 within the target current $I_{target}$ by decreasing the number of the enable bias signals which have a voltage level of the power supply voltage VDD and by decreasing the voltage level of the constant bias signal BCON.

A system in an embodiment of the present invention may include a power supply voltage detection block and an input buffer. The power supply voltage detection block may detect a voltage level of a power supply voltage. The input buffer may amplify an input signal based on the detection of the power supply voltage, which has been carried out at the power supply voltage detection block. The input buffer may include a current mirror circuit which includes first and second enable units. The first enable unit forms a current path when the power supply voltage is different from a normal level, and the second enable unit forms a current path when the power supply voltage has the normal level. The second enable unit may decrease a current path thereof when the power supply voltage becomes higher or lower than the normal level. The first and second enable units may selectively form a current path according to the detection of the power supply voltage.

It may be readily understood by a person skilled in the art to which the embodiment pertains that all combinations of a method for forming a current path by using a signal insensitive to a variation in the power supply voltage VDD and a method for forming a current path by using a signal relatively sensitive to a variation in the power supply voltage VDD may fall under the scope of the embodiment. While various embodiments have been described above, it will be understood to those skilled in the art that the embodiments described are by way of example only. Accordingly, the buffer circuit described herein should not be limited based on the described embodiments.

What is claimed is:

1. A buffer circuit comprising:
   a power supply voltage detection block configured to detect a voltage level of a power supply voltage;
   a bias generation block configured to generate a constant bias signal and a plurality of enable bias signals based on a detection result of the power supply voltage detection block; and
   an input buffer configured to amplify an input signal in response to the constant bias signal and the plurality of enable bias signals.

2. The buffer circuit according to claim 1, wherein a range of change in a level of the constant bias signal according to a variation in a level of the power supply voltage is smaller than a range of change in a level of each of the enable bias signals.

3. The buffer circuit according to claim 1, wherein the bias generation block comprises:
   a constant bias generation unit configured to generate the constant bias signal based on the detection of the power supply voltage, which has been carried out at the power supply voltage detection block; and
   an enable bias generation unit configured to generate the plurality of enable bias signals each of which has a level of one of a first voltage and a second voltage, which is lower than the first voltage, based on the detection of the power supply voltage.

4. The buffer circuit according to claim 3, wherein the first voltage is the power supply voltage.

5. The buffer circuit according to claim 3, wherein the constant bias generation unit comprises a variable current source which generates current changeable according to the detection result, and generates the constant bias signal which has a voltage level corresponding to the generated current.

6. The buffer circuit according to claim 3, wherein the enable bias generation unit changes the number of enable bias signals which have a voltage level of the first voltage based on the detection of the power supply voltage.

7. The buffer circuit according to claim 3, wherein the input buffer comprises:
   an amplification unit configured to sense and amplify the input signal and a reference voltage when current paths are formed;
   at least one first enable unit configured to form a current path in response to the constant bias signal; and
   at least two second enable units configured to form current paths in response to the plurality of enable bias signals.

8. The buffer circuit according to claim 7, wherein a range of change in an amount of current capable of flowing through the first enable unit according to a variation in a voltage level of the power supply voltage is smaller than a range of change in an amount of current capable of following through the second enable units.

9. The buffer circuit according to claim 7, wherein the constant bias generation unit and the first enable unit form a current mirror.

10. A buffer circuit comprising:
    the power supply voltage detection block configured to detect a level of a power supply voltage;
    a bias generation block configured to generate a plurality of enable bias signals based on the detection of the level of a power supply voltage, and a constant bias signal, which has a level change range more insensitive to a variation in the level of the power supply voltage than the enable bias signals; and
    an input buffer configured to amplify an input signal in response to the plurality of enable bias signals and the constant bias signal.

11. The buffer circuit according to claim 10, wherein the bias generation block comprises:
    a constant bias generation unit configured to generate the constant bias signal based on the detection of the power supply voltage, which has been carried out at the power supply voltage detection block; and
    an enable bias generation unit configured to generate the plurality of enable bias signals each of which has a level of one of a first voltage and a second voltage, based on the detection of the power supply voltage.

12. The buffer circuit according to claim 11, wherein the constant bias generation unit comprises a variable current source which generates current changeable according to the detection result, and generates the constant bias signal which has a voltage level corresponding to the generated current.

13. The buffer circuit according to claim 11, wherein the enable bias generation unit changes the number of enable bias signals which have a voltage level of the power supply voltage based on the detection of the power supply voltage.

14. The buffer circuit according to claim 11, wherein the input buffer comprises:

an amplification unit configured to sense and amplify the input signal and a reference voltage when current paths are formed;
at least one first enable unit configured to form a current path in response to the constant bias signal; and
at least two second enable units configured to form current paths in response to the plurality of enable bias signals.

15. The buffer circuit according to claim 14, wherein a range of change in an amount of current capable of flowing through the first enable unit according to a variation in a voltage level of the power supply voltage is smaller than a range of change in an amount of current capable of flowing through the second enable units.

16. The buffer circuit according to claim 14, wherein the constant bias generation unit and the first enable unit form a current mirror.

17. A system comprising:
a power supply voltage detection block configured to detect a voltage level of a power supply voltage;
a bias generation block configured to generate a constant bias signal and a plurality of enable bias signals based on a detection result of the power supply voltage detection block; and
an input buffer configured to amplify an input signal in response to the constant bias signal and the plurality of enable bias signals,
wherein the input buffer comprises first and second enable units, and wherein the first enable unit forms a current path when the power supply voltage is different from a normal level, and the second enable unit forms a current path when the power supply voltage has the normal level.

18. The system according to claim 17, wherein the second enable unit decreases an amount of current capable of flowing through the second enable unit when the power supply voltage becomes higher or lower than the normal level.

19. The system according to claim 17, wherein the first and second enable units selectively form a current path according to the detection of the power supply voltage.

* * * * *